United States Patent
Dagher et al.

(10) Patent No.: US 6,677,875 B2
(45) Date of Patent: Jan. 13, 2004

(54) SIGMA-DELTA ANALOG-TO-DIGITAL CONVERTER AND METHOD

(75) Inventors: Elias H. Dagher, Aliso Viejo, CA (US); Matthew Miller, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/134,300

(22) Filed: Apr. 29, 2002

(65) Prior Publication Data

US 2003/0201922 A1 Oct. 30, 2003

(51) Int. Cl.[7] .................................................. H03M 3/00
(52) U.S. Cl. ........................................ 341/143; 341/155
(58) Field of Search ................................. 341/143, 144, 341/155, 120, 118; 375/252

(56) References Cited

U.S. PATENT DOCUMENTS

| | | | | |
|---|---|---|---|---|
| 5,608,400 A | * | 3/1997 | Pellon | 341/143 |
| 5,936,562 A | * | 8/1999 | Brooks et al. | 341/143 |
| 6,124,813 A | * | 9/2000 | Robertson et al. | 341/143 |
| 6,304,608 B1 | * | 10/2001 | Chen et al. | 375/252 |
| 6,380,874 B1 | * | 4/2002 | Knudsen | 341/118 |
| 6,384,761 B1 | * | 5/2002 | Melanson | 341/143 |
| 6,411,232 B1 | * | 6/2002 | Miller et al. | 341/120 |

* cited by examiner

*Primary Examiner*—Jean Bruner Jeanglaude
(74) *Attorney, Agent, or Firm*—Fitch, Even, Tabin & Flannery

(57) ABSTRACT

A sigma-delta analog-to-digital converter (10) having DEM (14) facilitated data weighted averaging to select specific unit elements of a negative feedback loop digital-to-analog converter (15), which DEM (14) is comprised substantially of transmission gates that contribute little to propagation delay. As a result, the feedback signal provided by the feedback loop is not more than one clock cycle behind the present coded output of the ADC (10) itself. As a result, higher resolution converters can be realized. The DEM (14) utilizes a repeating sequence to select specific unit elements. In some embodiments the direction of sequence usage is reversed in various ways to aid in reducing harmonic distortion.

23 Claims, 4 Drawing Sheets

SIGMA-DELTA ANALOG-TO-DIGITAL CONVERTER AND METHOD

TECHNICAL FIELD

This invention relates generally to analog-to-digital conversion and more particularly to sigma-delta analog-to-digital conversion.

BACKGROUND

Analog-to-digital (A/D) conversion, including sigma-delta A/D converters, are known in the art. In general, A/D conversion serves to translate a given analog electrical signal (over a given range of potential signal values) into a series of corresponding digital counterparts. Such conversions are typically not 100% accurate and such inaccuracy gives rise to various artifacts including quantization noise and harmonic distortion. One source of such error lies with variability amongst the elements (current sources, resisters, and so forth) that comprise the digital-to-analog (D/A) converter that is embedded within the negative feedback loop of a sigma-delta A/D. Various prior art techniques have been proposed to attempt to minimize such noise under at least some operating conditions.

Dynamic element matching (DEM) is also known in the art. DEM has been previously used with Nyquist-based A/D conversion to select (either randomly or pursuant to a so-called calibration scheme) specific elements in the embedded D/A to thereby attempt to offset creation of some of the above artifacts. Typically, such approaches have tended to reduce harmonic distortion while raising the overall noise floor. For some applications this has been acceptable but satisfactory application has been limited.

To produce an A/D converter with improved resolution, one must use more bits, a faster clock, and/or more complicated noise shaping strategies. Notwithstanding some limited success, prior use of DEM (including variations known as individual level averaging and data weighted averaging) has not worked well to facilitate improved resolution in an A/D converter. One significant obstacle has been the propagation delay inherent to such an approach as versus the need to provide a relatively current negative feedback signal in the sigma-delta A/D converter. The more stale the feedback signal, the more likely the ultimate conversion will suffer errors and hence unwanted artifacts. Typically an A/D converter will output a next digital representation with each succeeding clock signal. Prior solutions have either required multiple clock cycles to support a large number of bits and/or unit elements (in the feedback loop D/A converter), thereby assuring that the feedback loop information will be stale as compared to the input information, or have limited the number of bits (typically 3 or 4) and/or unit elements of the feedback loop D/A converter (typically 8 to 16) to ensure that the feedback signal can be processed and presented in a timely fashion. These upward limits have retarded an ability to design an A/D converter supporting more bits and unit elements and hence, higher resolution.

A continuing need exists for a way to facilitate the design and fabrication of a sigma-delta analog-to-digital converter that can utilize more bits and unit elements and thereby achieve better resolution (over a given signal bandwidth) and/or a greater signal bandwidth with comparable resolution.

BRIEF DESCRIPTION OF THE DRAWINGS

The above needs are at least partially met through provision of the sigma-delta analog-to-digital converter described in the following detailed description, particularly when studied in conjunction with the drawings, wherein.

Figure 1:
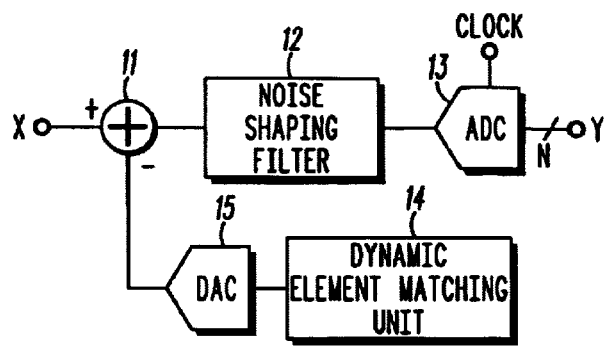
FIG. 1 comprises a block diagram of a sigma-delta analog-to-digital converter as configured in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Generally speaking, pursuant to these various embodiments, a sigma-delta analog-to-digital converter includes a clock, a converter output that is responsive to the clock such that newly determined output information is provided at the converter output with each clock pulse, and a negative feedback loop that is operably coupled to the converter output and that includes an embedded digital-to-analog converter that provides a feedback signal output that is operably coupled to an input of the analog-to-digital converter. The sigma-delta analog-to-digital converter further includes a dynamic element matching unit that is operably coupled to the embedded digital-to-analog converter, wherein the dynamic element matching unit ensures that a resultant feedback signal at the feedback signal output corresponds to output information that is no more than one clock cycle behind the most newly determined output information.

In one embodiment, the embedded digital-to-analog converter includes a plurality of unit elements that cumulatively form the resultant feedback signal. Usually, these unit elements will each contribute a value that is similar, but not identical, to the values potentially contributable by the other unit elements.

In one embodiment the dynamic element matching unit selects the individual unit elements that are to be used at any given time to collectively represent a given feedback signal. In general, the dynamic element matching unit assigns at least one particular unit element as a function of the converter output, wherein the converter output corresponds to an analog input to the input of the analog-to-digital converter that is prior to an analog input that is presently being presented to the input of the analog-to-digital converter. This selection can be based upon, for example, a previously stored repetitive sequential pattern. In one embodiment the beginning location within the sequential pattern is selected as a function, at least in part, of a most recently utilized unit element. In turn, the most recently utilized unit element can be a function of output information as was most recently determined.

In yet other embodiments, the direction in which the repetitive sequence is used can be modified in a variety of ways. Pursuant to one approach, the direction of using the sequence is reversed from time to time. The reversal trigger can be varied as appropriate to the application. Pursuant to one approach, reversal may be delayed until the sequence concludes on a previously identified unit element within the sequence.

Pursuant to these various embodiments a sigma-delta analog-to-digital converter can be fashioned that can considerably exceed prior practical considerations with respect to bits and/or unit elements. For example, while prior art converters of this type are more typically limited to 3 or 4 bits of resolution, these embodiments will readily support 6 bits of resolution—a factor of four improvement. Further, while prior art converters of this type are typically limited to 7 to 15 unit elements, at least some of these embodiments permit use of up to 63 unit elements and greater as the speed of integrated circuit technologies improve.

Referring now to the drawings, FIG. 1 depicts a sigma-delta analog-to-digital converter 10 that will support operation pursuant to the various embodiments taught herein. In a conventional fashion, this converter 10 includes an input for receiving an analog signal X. This input signal has a feedback signal subtracted 11 therefrom with the resultant signal passing through a noise shaping filter 12 and an analog-to-digital converter 13. The latter provides a digital representation Y that corresponds to its input with each clock pulse as received from a clock. A negative feedback loop containing a digital-to-analog converter 15 converts the digital output Y into a corresponding analog signal that is subtracted 11 from the incoming analog signal X as mentioned above. The above elements are typical components of a sigma-delta analog-to-digital converter and additional description thereof will not be provided for the sake of brevity and focus.

FIG. 1 also depicts a dynamic element matching unit 14 (DEM) in the negative feedback loop of the converter 10. The DEM 14 serves to select which unit elements of the digital-to-analog converter 15 are utilized to express a given converted digital input. In these embodiments, the DEM 14 utilizes at least one predetermined sequential pattern for so assigning the unit elements. The DEM 14 makes an appropriate assignment of the unit elements to both aid in minimizing creation of artifacts due to dissimilarities between the unit elements and within a short enough time frame to ensure that the feedback signal being provided at the input subtracter 11 is no more than one clock cycle behind the present output value Y.

Figure 2:
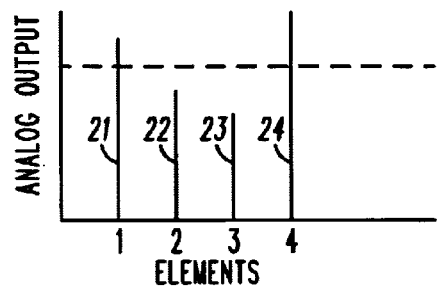
FIG. 2 comprises a graph conceptually illustrating differing analog outputs for different unit elements of a negative feedback loop digital-to-analog converter.

FIG. 2 represents at least part of the problem being addressed by the DEM 14. In the example provided, a given digital-to-analog converter has 4 unit elements. Ideally, each unit element provides an analog output signal that is exactly identical to one another. Under such conditions, if an analog signal of "3" is desired, and if each unit element provides an analog output value of "1," then the desired analog signal output of "3" could be obtained by simply combining any three unit elements. Unfortunately, however, unit elements are typically not exactly identical. Instead, as shown, some (21 and 24) may exceed a desired intended value by a varying amount and some (22 and 23) may fall short of the desired intended value. When combining different groups of three from such an assortment, a number of different variations of "3" as a combined analog output will of course result. Artifacts such as noise and harmonic distortion will result when using such unit elements. The DEM 14 in these embodiments, however, serves to use the unit elements in such as way as to generally minimize the overall noise floor and harmonic distortion levels attributable thereto.

Figure 3:
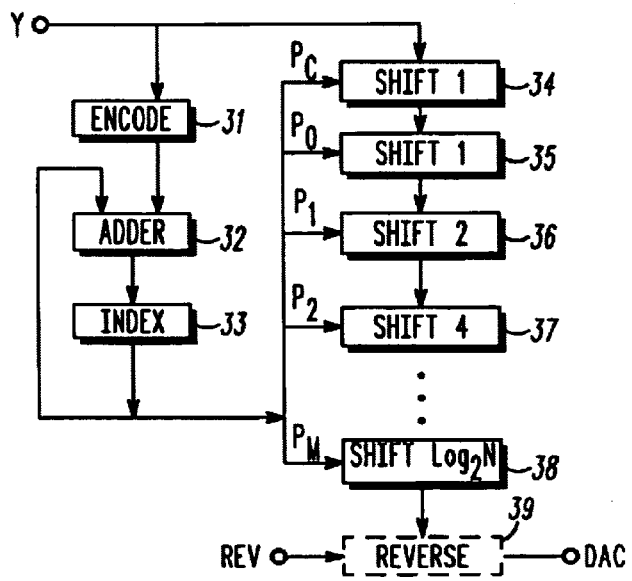
FIG. 3 comprises a block diagram detailed view of various embodiments of a dynamic element matching unit as configured in accordance with an embodiment of the invention.

Referring now to FIG. 3, the DEM 14 includes a mechanism for effectively using a predetermined sequence of unit elements. In a first embodiment of the invention, an index is used to store the pointer that identifies the starting element that will be used for the present code word being converted to analog form. Before discussing this index in greater depth, it may help to first explain the predetermined sequence pattern contemplated in this embodiment.

Figure 5:
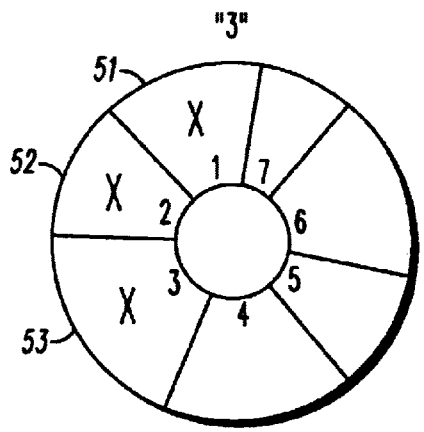
FIGS. 5 through 7 represent unit element assignment in accordance with an embodiment of the invention.

Presuming for purposes of this explanation a digital-to-analog converter having seven unit elements, these seven unit elements can be sequentially ordered into what effectively amounts to a sequentially indexed circular array. Such an array is logically depicted in FIGS. 5, 6, and 7. In these figures, the unit elements do not each comprise an equal portion of the circle. Instead, some, such as unit element number 7, are relatively smaller and others, such as unit element number 4, are relatively larger. These size differences exemplify the variations in the outputs of the unit elements as noted above.

Figure 6:
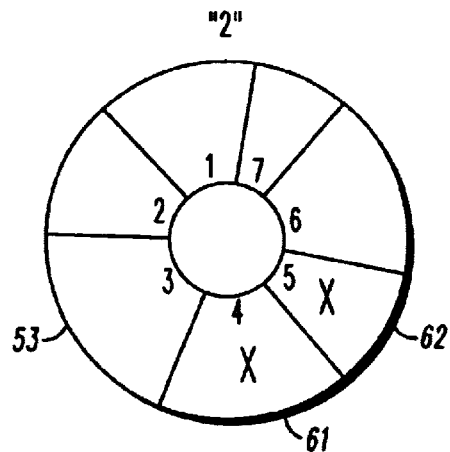
Figure 7:
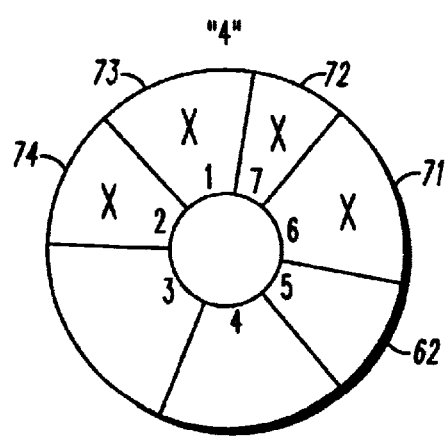

In this embodiment, the DEM 14 begins with unit element number 1 (51) and, to express the value of "3," will use three sequential unit elements 51, 52, and 53. As shown in FIG. 6, the DEM 14 will then begin selection of the next unit elements with the next unit element in the rotational sequence, in this case, unit element number 4 (61). Therefore, to express the value of "2," the DEM 14 will select two unit elements 61 and 62 beginning with the particular unit element as just specified. Similarly, and as depicted in FIG. 7, if the next value to express is "4," the DEM 14 would select unit element number 6 (71) and also use the next three unit elements 72, 73, and 74 in the rotational sequence.

As already noted, the DEM 14 uses an index to store the pointer to the starting unit element. More particularly, a present code word enters the DEM as a binary code and as a thermometer code. The thermometer-coded version passes through a barrel shifter 34 through 38 that is implemented with a plurality of transmission gates. The barrel shifter serves to rotate the thermometer code bits by an amount that is stored in the index 33. As the thermometer code is being rotated, the starting index for the next code word as provided by an encoder 31 is being calculated by summing in an adder 32 the current index with the binary value of the present code word.

The barrel shifter is controlled by the binary encoded index value. The barrel shifter is made up of a series of shifter cells. The first shifter cell rotates the thermometer encoded input by either one position or zero depending on the value of a single bit control signal. The second shifter cell rotates the thermometer encoded input by either two positions or zero depending on the value of its respective control signal. The third shifter cell rotates the thermometer encoded input by either four positions or zero depending on the value of its control signal. Each shifter cell is controlled by one of the binary digits of the index value—the least significant bit of the index controls the first shifter cell, the next least significant bit controls the second shifter cell, and so on. The number of shifter cells required is equal to the number of digits contained in the index.

Normally, the maximum value contained in the index is the binary representation of the number of unit elements in the DAC. Because the index value is always being incremented by some positive value, however, the adder will occasionally overflow and generate a carry value. To accommodate the overflow situation, an additional index bit and a corresponding shifter cell is provided in a preferred embodiment that is controlled by the index carry bit. Shifting by zero units and shifting by the number of units in the DAC are equivalent situations. Similarly, shifting by one unit and shifting by the number of unit elements plus one are also equivalent situations. From this, it can be shown that whenever a carry bit is generated by the binary arithmetic the proper response of the barrel shifter is to shift the thermometer encoded control to the DAC by one position.

Figure 4:
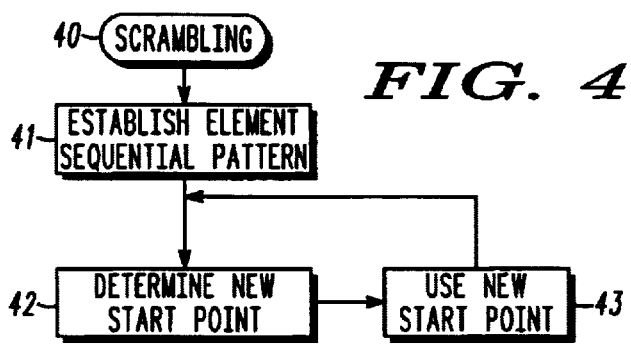
FIG. 4 comprises a flow diagram of a process as configured in accordance with an embodiment of the invention.

Referring now to FIG. 4, in effect, the DEM 14 serves to scramble 40 the use of the unit elements by establishing an element sequential pattern 41 (such as the sequential repeating pattern described above) and then using the number of unit elements most recently used and the previous start point to identify and update 42 a new start point. That new start point is then used 43 to assign a next sequence of unit elements.

In this way, this embodiment is able to reduce the amount of delay typically needed by prior art data weighted averaging approaches. Reducing the delay in the feedback path helps to maintain the stability of the delta-sigma feedback loop and allow for more bits to be accommodated in the DAC.

The above approach can aid in lowering the effective noise floor. Such an approach, however, will not necessarily aid in minimizing harmonic distortion. Signal dependent tones can cause the described process to periodically select the same elements. When this happens, correlated tones will often result at the output of the digital-to-analog converter. To aid in reducing such distortion, the direction in which the DEM 14 uses the predetermined repeating sequence can be reversed 39 (FIG. 3) from time to time. Pursuant to one simple approach, the DEM 14 can reverse the direction of rotation with each iteration of the index. Such an approach may be suitable for some applications but often is not sufficient to satisfactorily reduce the tone problem. Two alternative approaches are now presented.

Figure 8:
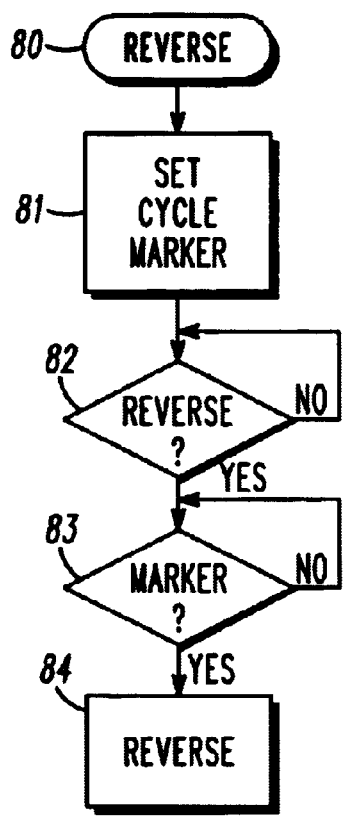
FIG. 8 comprises a flow diagram for details pertaining to an alternative approach as configured in accordance with an embodiment of the invention.

In a first preferred approach, set forth in FIG. 8, the reverse operation 80 sets 81 a cycle marker to specify a location where a current direction of rotation begins and then monitors 82 for a reverse command (such a command can be provided in a variety of ways including on a pseudorandom basis). When a reverse indication occurs, the process then determines 83 whether the sequence has again arrived exactly at the previously set cycle marker. When the sequence does eventually achieve this coincidence, at that point the process reverses 84 the direction of rotation and the process can begin anew. This process is relatively simple and is relatively effective in minimizing harmonic distortion.

Figure 9:
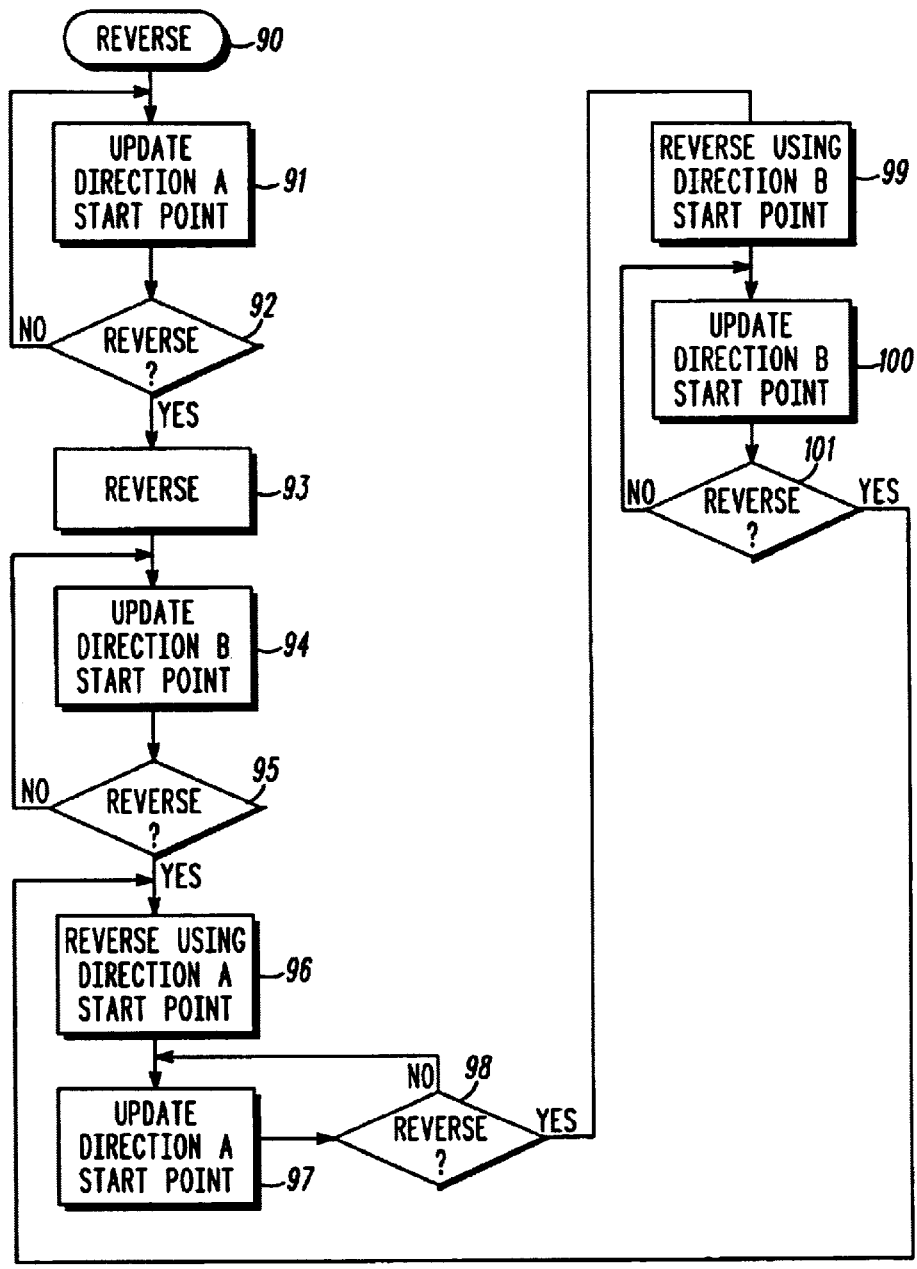
FIG. 9 comprises a flow diagram for details pertaining to yet another alternative approach as configured in accordance with an embodiment of the invention.

In an alternative, less preferred approach, the reversing process reverses whenever a reversing indication is made, but the sequence, once reversed, will start at a starting point that corresponds to the last time the sequence was progressing in this direction. In short, the DEM 14 now tracks two starting points, one for each direction of rotation, and uses them accordingly. FIG. 9 presents one way to achieve such an approach. Again, the reversing process 90 continuously updates 91 the startpoints for the sequence when progressing or rotating in a given direction A. Upon detecting 92 a reverse instruction or signal, the process reverses 93 the order of rotation while using the present startpoint as the relevant point of interest. The process then updates 94 the startpoints that correspond to progressing through the sequence in direction B.

When a reverse signal is next detected 95, the process reverses 96 the sequence to rotate in direction A beginning at the starting point that corresponds as described to the last startpoint used when rotating in direction A. This, again, is in the alternative to reversing direction and using the most recent direction B startpoint for reference. Direction A startpoints are again updated 97 until a new reverse signal is detected 98, at which point the process reverses 99 the sequence direction to direction B and begins anew with a starting point that correlates to the startpoint for the last time the sequence was progressing in direction B. Direction B startpoints are then updated 100 as before until, again, a reverse instruction is detected 101 and the process continues as described.

So configured, and viewed another way, it can be seen that the assignment of control lines to respective digital-to-analog unit elements is completed before the control lines have arrived at their respective next states. Further, it can be seen that the assignment of such control lines is dependent only upon previous states of the control lines and does not depend upon knowledge of the present state of the control lines. These conditions facilitate completion of the appropriate rearrangement of the connection(s) between the thermometer encoded quantizer output lines and the digital-to-analog converter before the quantizer arrives at its next state (and also without knowledge of the quantizer's present state). These configurations also benefit temporally because the arithmetic unit used to perform the computation of the assignment of the quantizer output lines to the digital-to-analog converter unit elements is performed outside of the negative feedback loop, such that the arithmetic unit adds no appreciable delay to the feedback loop.

In effect, pursuant to these embodiments, the DEM utilizes a form of data weighted averaging while no longer necessitating in-line logic activity that unduly contributes to propagation delay through the feedback loop. Instead, the propagation delay owing to D/A converter unit element selection is largely dependent on the propagation delay of transmission gates alone. Since the latter are typically temporally efficient, the feedback path delay is reduced and therefore allowing of more bits in the overall delta-sigma converter. Such bits can either be used for extended signal bandwidth, resolution, or a combination of both.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. It should particularly be noted that these teachings are applicable to single-ended digital-to-analog converters and to fully-differential digital-to-analog converters as used in the feedback loop of an analog-to-digital converter.

We claim:

1. A sigma-delta analog-to-digital converter having:

a clock;

a converter output operably coupled to the clock such that newly determined output information is provided with each clock pulse;

a negative feedback loop operably coupled to the converter output and comprising an embedded digital-to-analog converter that provides a feedback signal output that is operably coupled to an input of the analog-to-digital converter;

a dynamic element matching unit operably coupled to the embedded digital-to-analog converter, wherein the dynamic element matching unit ensures a resultant feedback signal at the feedback signal output that corresponds to output information that is no more than one clock cycle behind the most newly determined output information and wherein the dynamic element matching unit assigns at least one particular element in the embedded digital-to-analog converter as a function of the converter output, wherein the converter output corresponds to an analog input to the input of the analog-to-digital converter that is prior to an analog input that is presently being presented to the input of the analog-to-digital converter.

2. The sigma-delta analog-to-digital converter of claim 1 wherein the embedded digital-to-analog converter is comprised of a plurality of unit elements that cumulatively form the resultant feedback signal.

3. The sigma-delta analog-to-digital converter of claim 2 wherein the plurality of unit elements each selectively contributes either of at least two possible values to the resultant feedback signal.

4. The sigma-delta analog-to-digital converter of claim 3 wherein one of the at least two possible values represents a logical low.

5. The sigma-delta analog-to-digital converter of claim 4 wherein a remaining one of the at least two possible values is an amount that is substantially identical for each of the plurality of unit elements.

6. The sigma-delta analog-to-digital converter of claim 5 wherein the remaining one of the at least two possible values is not exactly equal for each of the plurality of unit elements.

7. The sigma-delta analog-to-digital converter of claim 6 wherein the dynamic element matching unit selects individual unit elements to thereby form the resultant feedback signal pursuant to at least one previously stored repetitive sequential pattern.

8. The sigma-delta analog-to-digital converter of claim 7 wherein the dynamic element matching unit further selects individual unit elements to thereby form the resultant feedback signal based, at least in part, upon a most recently utilized individual unit element.

9. The sigma-delta analog-to-digital converter of claim 7 wherein the dynamic element matching unit forms the resultant feedback signal by identifying a beginning location and a concluding location within the previously stored repetitive sequential pattern.

10. The sigma-delta analog-to-digital converter of claim 9 wherein the dynamic element matching unit forms the resultant feedback signal for use in determining next-to-be-determined output information by identifying a beginning location and a concluding location within the previously stored repetitive sequential pattern of individual unit elements as based, at least in part, upon most recently determined output information.

11. A method of converting analog information into corresponding digital information, comprising:
within one clock cycle:
providing digital information that corresponds to a most recently provided analog information sample to thereby provide a digital feedback signal;
using a predetermined repetitive sequential pattern of individual unit element usage to convert the digital feedback signal into a corresponding analog feedback signal;

providing current analog information;
comparing the current analog information with the analog feedback signal to provide a resultant analog signal;
converting the resultant analog signal to provide the corresponding digital information.

12. The method of claim 11 wherein using a predetermined repetitive sequential pattern of individual unit element usage to convert the digital feedback signal into a corresponding analog feedback signal includes only selecting sequentially contiguous individual unit elements within the predetermined repetitive sequential pattern of individual unit element usage to convert the digital feedback signal into a corresponding analog feedback signal.

13. The method of claim 12 wherein only selecting sequentially contiguous individual unit elements within the predetermined repetitive sequential pattern of individual unit element usage to convert the digital feedback signal into a corresponding analog feedback signal includes selecting a particular beginning location of the sequentially contiguous individual unit elements as a function of a most recently selected sequence of contiguous individual unit elements.

14. The method of claim 13 wherein selecting a particular beginning location of the sequentially contiguous individual unit elements as a function of a most recently selected sequence of contiguous individual unit elements includes selecting a particular beginning location of the sequentially contiguous individual unit elements as a function of the individual unit element that concluded the most recently selected sequence of contiguous individual unit elements.

15. The method of claim 12 wherein only selecting sequentially contiguous individual unit elements within the predetermined repetitive sequential pattern of individual unit element usage to convert the digital feedback signal into a corresponding analog feedback signal includes selecting a particular concluding location of the sequentially contiguous individual unit elements as a function of a most recently selected sequence of contiguous individual unit elements.

16. The method of claim 15 wherein selecting a particular concluding location of the sequentially contiguous individual unit elements as a function of a most recently selected sequence of contiguous individual unit elements includes selecting a particular concluding location of the sequentially contiguous individual unit elements as a function of the individual unit element that concluded the most recently selected sequence of contiguous individual unit elements.

17. The method of claim 11 wherein using a predetermined repetitive sequential pattern of individual unit element usage to convert the digital feedback signal into a corresponding analog feedback signal includes continuing in a same direction of the predetermined repetitive sequential pattern of individual unit elements usage as was most recently used to convert a previous digital feedback signal into a corresponding previous analog feedback signal.

18. The method of claim 11 wherein using a predetermined repetitive sequential pattern of individual unit element usage to convert the digital feedback signal into a corresponding analog feedback signal includes reversing a direction of the predetermined repetitive sequential pattern as compared to a direction of the predetermined repetitive sequential pattern of individual unit elements usage as was most recently used to convert a previous digital feedback signal into a corresponding previous analog feedback signal.

19. The method of claim 18 wherein reversing the direction includes reversing the direction on a substantially periodic basis.

20. The method of claim 19 wherein reversing the direction on a substantially periodic basis includes reversing the direction every other clock cycle.

21. The method of claim 18 wherein reversing the direction includes reversing the direction on a substantially non-periodic basis.

22. The method of claim 21 wherein reversing the direction on a substantially non-periodic basis includes reversing the direction on at least a pseudorandom basis.

23. The method of claim 18 wherein reversing the direction includes only reversing the direction when a particular beginning location within the predetermined repetitive sequential pattern has also been selected.

* * * * *